US006392504B1

(12) United States Patent
Stein

(10) Patent No.: US 6,392,504 B1
(45) Date of Patent: May 21, 2002

(54) DEVICE FOR COUPLING RADIO FREQUENCY ENERGY FROM VARIOUS TRANSMISSION LINES USING VARIABLE IMPEDANCE TRANSMISSION LINES WITH CABLE TAP

(75) Inventor: Richard P. Stein, Princeton, TX (US)

(73) Assignee: InnerWireless, Inc., Richardson, TX (US)

( * ) Notice: Subject to any disclaimer, the term of this patent is extended or adjusted under 35 U.S.C. 154(b) by 0 days.

(21) Appl. No.: 09/563,328

(22) Filed: May 3, 2000

Related U.S. Application Data

(60) Provisional application No. 60/169,722, filed on Dec. 8, 1999.

(51) Int. Cl.[7] .................................................. H03H 7/38
(52) U.S. Cl. .......................... 333/125; 333/33; 333/136
(58) Field of Search ................................ 333/125, 100, 333/33, 136, 132

(56) References Cited

U.S. PATENT DOCUMENTS

| | | | | |
|---|---|---|---|---|
| 2,805,399 | A | 9/1957 | Leeper | 333/136 |
| 2,843,827 | A | 7/1958 | Blonder | 333/136 |
| 2,891,222 | A | 6/1959 | Freen | 333/124 |
| 4,190,816 | A | 2/1980 | Moss et al. | 333/131 |
| 4,335,364 | A | 6/1982 | Schmitz et al. | 333/33 |
| 4,618,838 | A | 10/1986 | Kajiwara et al. | 333/33 |
| 4,902,989 | A | 2/1990 | Glaab | 333/100 |
| 4,951,012 | A | 8/1990 | Oppelt et al. | 333/33 |
| 5,281,933 | A | 1/1994 | Chamberlin | 333/132 |
| 5,384,558 | A | 1/1995 | Maruhashi | 333/33 |
| 5,689,218 | A | 11/1997 | Stein | 333/125 |
| 5,729,184 | A | 3/1998 | Paxman et al. | 333/125 |

*Primary Examiner*—Robert Pascal
*Assistant Examiner*—Dean Takaoka
(74) *Attorney, Agent, or Firm*—Haynes and Boone, LLP

(57) ABSTRACT

A coupler for coupling a selected amount of energy from a transmission line 100 includes a contact 104 for contacting an inner conductor 102 of transmission line 100 through an aperature through an outer conductor of transmission line 100. A wire 106 of a preselected configuration is coupled to contact 104 and is spaced from a ground plane 108 to create a selected parasitic capacitance, the configuration of wire 106 defining a center frequency of the coupler. Coupler also includes a connector 110 having an inner conductor 111 coupled to wire 106.

18 Claims, 2 Drawing Sheets

DEVICE FOR COUPLING RADIO FREQUENCY ENERGY FROM VARIOUS TRANSMISSION LINES USING VARIABLE IMPEDANCE TRANSMISSION LINES WITH CABLE TAP

CROSS-REFERENCE TO RELATED APPLICATION

This application claims the benefit of U.S. Provisional Patent Application No. 60/169,722 filed Dec. 8, 1999.

BACKGROUND OF THE INVENTION

1. Field of the Invention

The present invention relates in general to radio frequency devices and in particular to methods and devices for coupling radio frequency energy from transmission lines.

2. Description of the Related Art

Until this invention, coaxial taps and couplers were installed by cutting and connectorizing RF cable using coaxial jumpers. The primary disadvantage of this methodology is the resulting excessive loss to the host cable. Stein et al, U.S. Pat. No. 5,729,184, subsequently taught that a tap can be used without connectorization; however, the Stein et al. invention still caused losses of over 1 dB to the host cable. Stein et al did mention the theoretical ability to devise taps with coupling losses up to 20 dB but did not describe a method for the manufacture of such devices.

What are needed are methods and devices embodying the ability to select the coupling loss and accompanying insertion loss in RF systems. In particular, such methods and devices should allow a wireless system not only to be tuned but also should also allow minimization of number of amplifiers required to RF illuminate a structure.

SUMMARY OF THE INVENTION

The present invention relates generally to devices which couple electromagnetic energy from one electromagnetic transmission medium to one or more other transmission media and more specifically to devices which couple radio frequency energy from a coaxial cable to other coaxial cables, antennae or other radiating devices. Further, the present invention relates to devices which couple radio frequency energy from a transmission medium to another transmission or radiating medium, with variable energy and inverse loss to the host cable.

The present invention also generally relates to a device packaging or enclosure method which protects the electrical components, allows for sealing against water or other contaminant intrusions, generally allows for connecting the device to a host cable while preventing rotation, and provides a means of electrically connecting the ground of one device to the ground of another device. The present invention further relates to a device which can be attached to a host cable without the need to cut and connectorize the cable.

The principles of this invention provide not only the ability to build couplers with coupling losses from below 10 dB to over 30 dB but for the manufacture of such devices. The construction of these devices provides extremely low insertion losses at all values of RF coupling losses. For example, a coupling device of the present invention with a coupling loss of 15 dB will have an insertion loss of less than 0.3 dB. A 20 dB loss device will have an insertion loss of less than 0.1 dB.

Therefore, it is an object of the invention to provide means of presenting a large impedance to the through line cable while extracting RF energy efficiently.

It is a further object of the invention to provide a technique to connect a device to a through line such that RF energy may be extracted at several frequencies.

Another object of the invention is to provide a method of extracting RF energy from a through line at several frequencies while minimizing the loss in the through line.

It is a further object of the invention to provide a technique to extract RF energy from a through line at varying levels depending upon need.

Another object of the invention is to extract energy at varying levels while causing an inverse loss to the through line. That is the higher the coupling loss from the through line to the output of the object of the invention, the lower the insertion loss to the through line.

Yet another object of the invention is to provide a technique that allows an output impedance of the device to match, as close as possible, the input/output impedance of an RF amplifier, an antenna or another transmission line.

A further object of the invention is to provide a means of extracting RF energy from a through line while creating minimum intermodulation products.

It is a further object of the invention to provide a technique to extract RF energy from a through line while providing a minimum of loss in the through line at other frequencies.

Another object of the invention is to provide a technique to attach the device to a through line and transferring the energy to the output of the device with the maximum efficiency, that is the minimum heating loss.

Yet another object of the invention is to provide a means of transferring energy from the through line to the output of the device such that the ratio of RF energy flow will be little affected by temperature, humidity and/or vibration.

A further object of the invention is to provide a means of inexpensively and efficiently assembling the device.

Another object of the invention is to provide a technique to manufacture or assemble a coupling device to respond to different frequencies, bandwidths, coupling losses and through line losses using preformed internal wiring.

Still another object of the invention is to accomplish the energy transfer using a variable impedance transmission line.

Yet another object of the invention is to provide a technique that couples energy from a through line to the output of the device using a single, bare conductive wire as the variable impedance transmission line.

Another object of the invention is to provide a means of controlling the energy coupled from a host cable to the output of the device by adjusting the distance and configuration of the wire from the connection to the host cable.

Yet another object of the invention is to provide a mechanical package to contain the electrical components.

Still another object of the invention is to provide a mechanical package that can be sealed to prevent water or other contaminants from degrading the electrical performance of the device.

Another object of the invention is to provide a device which can be connected to a host cable by drilling only one hole and placing the device on the cable and tightening 2 captive screws.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1A:
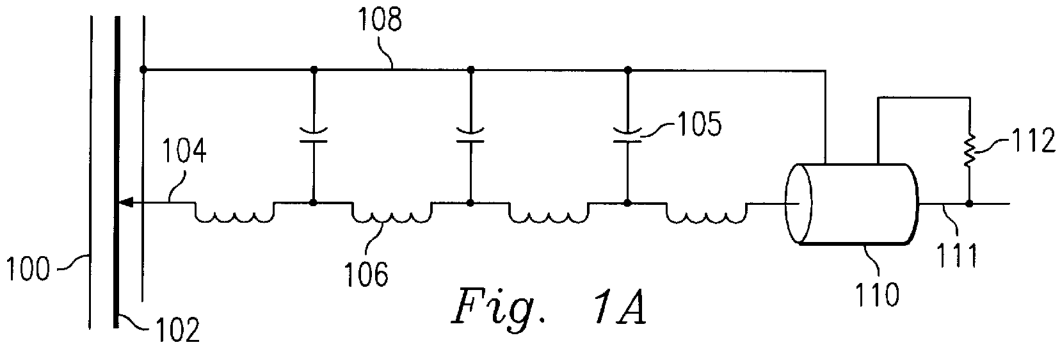
FIG. 1A is a schematic of a coupling device according to the principles of the invention.
Figure 1B:
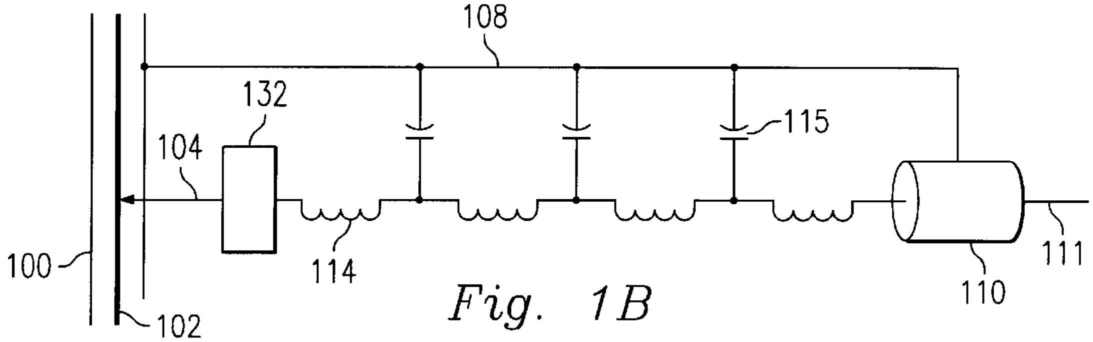
FIG. 1B is a schematic diagram of a second coupling device according to the principles of the invention.
Figure 1C:
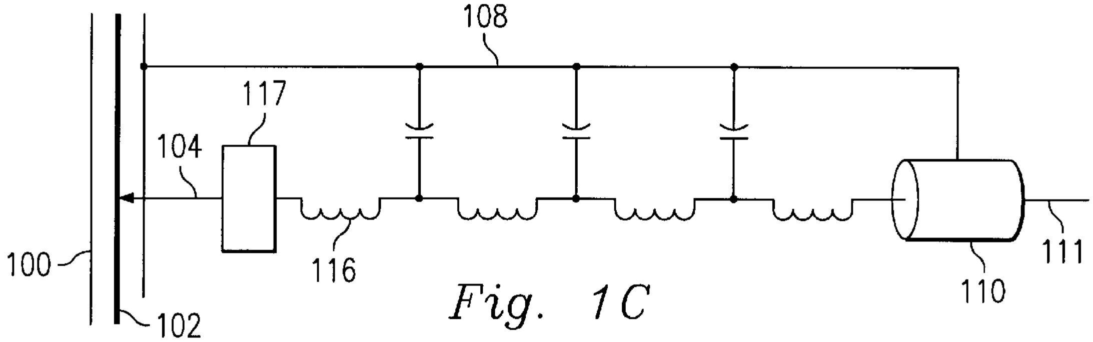
FIG. 1C is a schematic diagram of a third coupling device according to the principles of the invention.
Figure 1D:
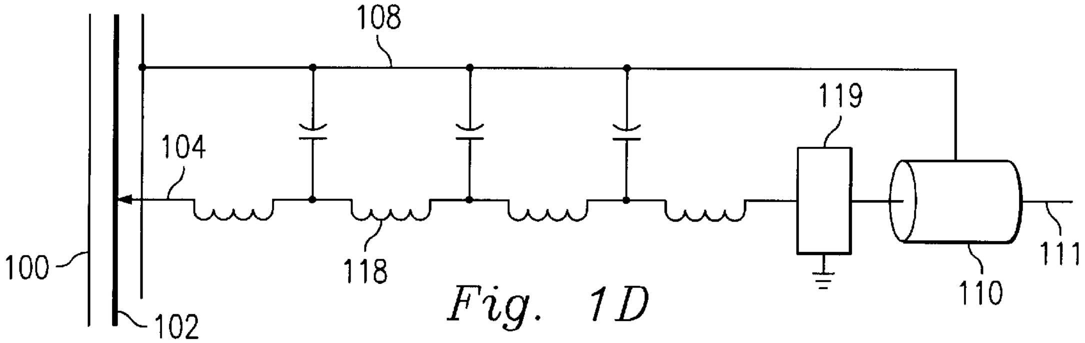
FIG. 1D is a schematic diagram of a fourth coupling device according to the principles of the invention.
Figure 2:
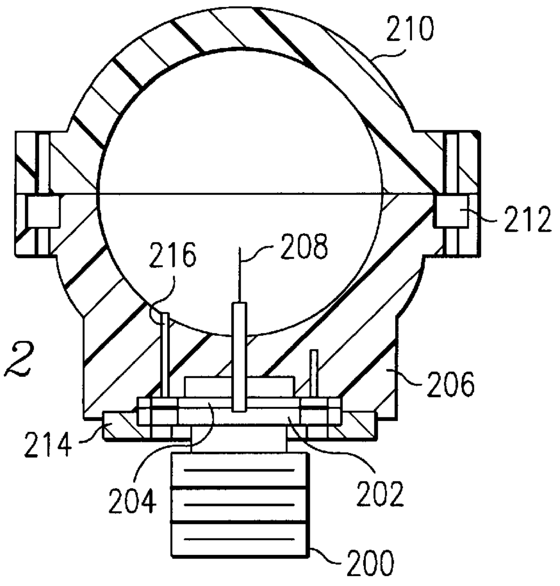
FIG. 2 shows an assembly and section view of the coupling device according to the principles of the invention.

The principles of the present invention and their advantages are best understood by referring to the illustrated embodiment depicted in FIGS. 1–3 of the drawings, in which like numbers designate like parts.

Figure 3A:
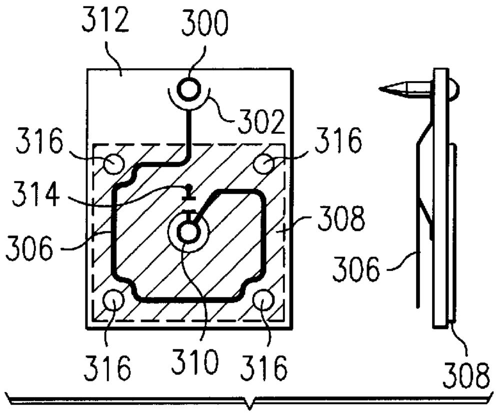
FIG. 3A shows an electronic assembly of an ultra low insertion loss, high coupling loss a coupling device such as that shown schematically in FIG. 1B.
Figure 3C:
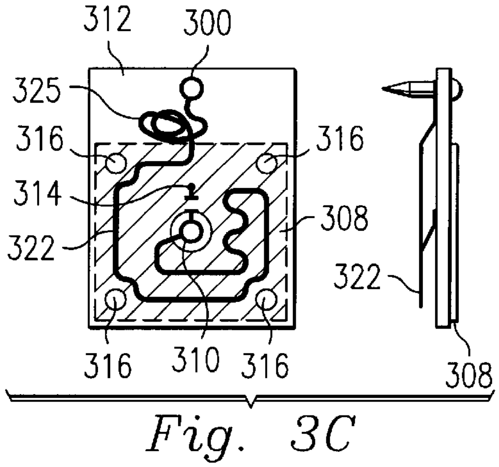
FIG. 3C shows an electronic assembly of a low insertion loss, low coupling loss coupling device such as that shown schematically in FIG. 1C.
Figure 3B:
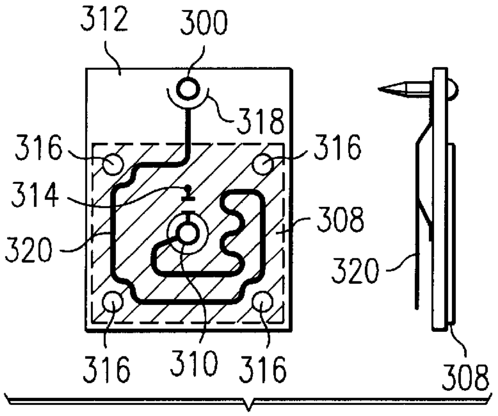
FIG. 3B shows an electronic assembly of a low insertion loss, medium coupling loss coupling device such as that shown schematically in FIG. 1B.
Figure 3D:
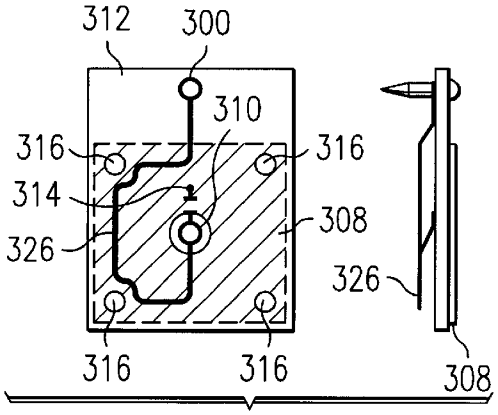
FIG. 3D shows an electronic assembly of a low insertion loss, high frequency coupling device such as that shown schematically in FIG. 1A.

FIGS. 1A and 3D respectively show a schematic and layout of a coupling device for coupling RF energy from a coaxial cable to a second coaxial cable, RF radiator or RF amplifier. Although a coaxial cable is represented, it is understood that any transmission line can be substituted and tapped. A hole is drilled into the host transmission line outer conductor 100 and a contact 104 (shown in FIG. 3D at 300) is inserted to make contact with the host transmission line center conductor 102. The contact might be spring loaded, but it is understood that any means of contacting the center conductor will suffice. It is preferable that the center conductor contact 104 (300) be insulated, but it is not necessary to meet the principles of the invention. Insulation on the shaft of the contact 104 (300) is provided to prevent inadvertent contact with the outer conductor 100.

The coupler internal transmission line 106 (shown in FIG. 3D at 326) is a low loss wire. The length and diameter of the wire determine the frequency response and to some degree, the coupling loss and insertion loss of the device. The transmission line wire may be insulated to allow longer length for lower frequencies and still meet the intent of the invention.

One principle of the invention is the use of highly conductive wire. This prevents dielectric loss through insulation.

The wire is connected to the center conductor pin 111 (310) of an output connector represented by outer conductor 110 and center conductor 111 (310). It is understood that the output may be a hard-wired cable, a directly connected antenna, amplifier or a dummy load. Any of these will meet the principles of the invention.

Loss element 112 (314) is connected between the center pin 111 (310) of the output connector and the outer shield 110 to provide a closer impedance match to the device connected to the output connector. The loss element adds to the performance of the invention, but is not required to meet the principles of the invention.

The configuration of FIGS. 1A and 3D is used for coupling devices with coupling values from near −15 dB to −6 dB. The loss element of the internal transmission line 106 (326) is a low loss wire. The length and diameter of the wire determine the frequency response and to some degree, the coupling loss and insertion loss of the device. Parasitic capacitors 105 are formed by the diameter of the wire and the distance from a ground plane 108 (308) (202, FIG. 2), shown in FIG. 3D. The parasitic capacitance and the configuration of the wire determine the center frequency response of the device. The transmission line wire may be insulated to allow longer length for lower frequencies and still meet the intent of the invention. As shown in FIG. 3D, the PC board 312 includes holes 316 for purposes that will be described in greater detail below.

FIGS. 1B, 3A and 3B are respectively schematic and layout diagrams of an alternate coupling device for coupling a minimum amount of RF energy from a host cable to an output connector while minimizing the insertion loss in the host cable in accordance with the principles of the invention.

A hole is drilled into the host transmission line outer conductor 100 and a contact 104 (300) is inserted to make contact with the host transmission line center conductor 102. The contact might be spring loaded, but it is understood that any means of contacting the center conductor will suffice. It is preferable that the center conductor contact 102 be insulated, but it is not necessary to meet the principles of the invention.

The internal transmission line 114 (306 and 320 in FIGS. 3A and 3B) is a low loss, non-insulated wire but may be insulated for longer lengths to accommodate lower frequencies and still meet the principles of the invention. The transmission line wire is not to be in contact with any dielectric except where it is connected to the terminal points.

The length and diameter of the wire determine the frequency response and to some degree, the coupling loss and insertion loss of the device. The parasitic capacitors 115 are formed by the diameter of the wire and the distance from a ground plane 108 (308) shown in FIG. 3A. The parasitic capacitance and the configuration of the wire determine the center frequency response of the device.

One principle of the invention is the use of highly conductive wire. This prevents dielectric loss through insulation. Still another principle of the invention is to prevent the transmission line wire from contacting any dielectric surface except at the point of connection.

The wire is connected to the center conductor pin 111 (310) of an output connector represented by outer conductor 110 and center conductor 111 (310). It is understood that the output may be a hard-wired cable, a directly connected antenna, amplifier or a dummy load. Any of these will meet the principles of the invention.

A further principle of the invention is to not connect the transmission line to the center contact 102 (300), but using capacitive coupling, sample the field around pin 102 as shown in detail in FIGS. 3A and 3B at 302 and 318. The greater the sampling, the greater the coupling energy.

In FIG. 1B, an element 132 represents a complex impedance, dc blocked connection between the transmission line 114 and the pin 104 connecting the center conductor 102 of the host cable. This connection is further shown in FIGS. 3A and 3B. As seen in FIGURE A, the connection can be small allowing a small amount of power to be coupled (from 20 to 30 dB) or larger per FIG. 3B allowing coupling values of from 15 to 20 dB. The high coupling loss causes insertion losses from 0.3 to 0.05 dB.

The configuration of FIGS. 1C and 3C allows a coupling device to pass several selected frequencies with accompanying low insertion loss at those frequencies. In FIG. 1C the internal transmission line is shown at 116 and in FIG. 3C at 322. The lumped impedance 117 on FIG. 1C and the coil 325 shown on FIG. 3C allows the coupling device to be configured to emphasize selected frequencies while minimizing the insertion loss at selected frequencies.

A further principal of this invention using the lumped impedance input, such as shown in FIGS. 1C and 3C and the selected coupling of FIGS. 1B and 3A and 3B allows the designer to not only select the coupling, insertion loss, but also allow him or her to select the required frequencies so that several frequencies can be sent and received on the same cable.

FIG. 1D generally relates to this invention with a dc blocked, complex impedance 119 at the input of the coupled port. This allows the designer to configure the coupling device to customize the return loss and to some extent the frequency response. Here, the transmission line (internal) is shown at 118.

FIG. 3D generally relates to the invention for coupling devices used for single frequencies at frequencies around 2 GHz. The principals requiring different wire sizes to select the coupling loss and insertion loss apply to this device as for the other devices described herein. It is understood that any combination of the principals of this invention are included as part of this invention.

FIG. 2 generally relates to the mechanical aspects of the invention. The package consists of 3 plastic parts, the bottom 210, the top 206 and the top seal 214. The coupled port connector 200 is shown as a type "N", but any applicable RF connector can be used The connection to the coupled port may also be a "clamp-on" or "hard-wired". The connection to the host cable is 208, but it is understood that any probe or other means of contacting the host center conductor will meet the principals of the invention.

Captive screws 212 are used to connect the top and bottom of the device to the host cable. Captive screws are used to facilitate installation.

Screws 216 are disposed on opposite corners of the connector flange extending through holes 316 in PC board 312 (204, FIG. 2), and act as anti-rotation as well as providing a ground path from the host cable to the outer conductor of the coupled port. Although the anti-rotation is not required to allow the device to function, it adds to the overall strength. The ground is not required for operations above 400 mHz, but does add to the overall electrical stability. The screws 216 will generally be partially installed at the time of manufacture and will be finally installed at the time of installation.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. A coupler for coupling a selected amount of energy from a transmission line comprising a contact for contacting an inner conductor of said transmission line through an aperture through an outer conductor of said transmission line;

a wire of a preselected configuration coupled to said contact and spaced from a ground plane to create a selected parasitic capacitance, said configuration of said wire defining a center frequency of said coupler; and a connector having an inner conductor coupled to said wire;

wherein at least a portion of said wire is spaced from said ground plane at least in part by an air gap.

2. The coupler of claim 1 wherein said contact is capacitively coupled to said wire.

3. The coupler of claim 1 wherein said contact is physically connected to said wire.

4. The coupler of claim 1 wherein said wire comprises a highly conductive surface.

5. The coupler of claim 1 and further comprising a lossy element coupling said inner conductor of said connector and an outer shield of said connector.

6. The coupler of claim 1 and further comprising a complex impedance disposed between said contact and said wire.

7. The coupler of claim 6 wherein said impedance comprises a complex impedance creating a dc blocked connection between said contact and said wire.

8. The coupler of claim 6 wherein said impedance comprises a lumped impedance selected to create corresponding coupling and insertion losses.

9. A radio frequency coupler comprising:

a contact for contacting a conductor of an associated transmission line;

a wire spaced at least in part from a supporting structure and a ground plane by an air gap, a configuration of said wire and said spacing from said ground plane defining a frequency response of said coupler;

a connector having a conductor coupled to said wire and a flange; and a package coupled to said flange of said connector and enclosing said wire and said support structure, said package further forming a cavity for receiving said transmission line, said contact extending into said cavity to contact said conductor of said transmission line.

10. The radio frequency coupler of claim 9 wherein said package comprises first and second separable portions defining said cavity, each of said first and second portions including receptacles for receiving fastener means for holding said transmission line in engagement with said coupler.

11. The radio frequency coupler of claim 9 wherein said fastener means comprise captive screws.

12. The radio frequency coupler of claim 9 wherein at least a portion of said package is formed of plastic.

13. The radio frequency coupler of claim 9 further comprising conductive fastener means coupling said flange of said connector and said ground plane.

14. A method of coupling energy from a transmission line having spaced apart inner and outer conductors comprising the steps of:

forming an aperture through the outer conductor of the transmission line to expose a portion of the inner conductor;

inserting a contact through the aperture to contact the inner conductor;

disposing a wire of a preselected configuration spaced form a ground plane to create a parasitic capacitance defining a center frequency of the energy being coupled from the transmission line; and electrically coupling the contact and the wire;

wherein said step of disposing comprises the step of disposing a wire spaced at least in part from the ground plane by an air gap.

15. The method of claim 14 where said step of electrically coupling comprises the step of capacitively coupling the wire and the contact.

16. The method of claim 14 further comprising the step of disposing a lumped impedance between the contact and the wire.

17. The method of claim 14 wherein said step of forming a wire of a preselected configuration comprises the step of disposing a wire of a preselected length and diameter spaced from the ground plane.

18. The method of claim 14 wherein said step of disposing comprises the step of disposing a wire spaced from a first side of a support structure by an air gap, the ground plane disposed on an opposing second side of the support structure.

* * * * *